(12) United States Patent
Chatradhi et al.

(10) Patent No.: US 9,229,813 B2
(45) Date of Patent: Jan. 5, 2016

(54) ERROR CORRECTION WITH ON-DEMAND PARITY SECTORS IN MAGNETIC DATA STORAGE DEVICES

(71) Applicant: HGST Netherlands B.V., Amsterdam (NL)

(72) Inventors: Sridhar Chatradhi, San Jose, CA (US); Martin Aureliano Hassner, Mountain View, CA (US); Kirk Hwang, Palo Alto, CA (US); Satoshi Yamamoto, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 84 days.

(21) Appl. No.: 14/199,807

(22) Filed: Mar. 6, 2014

(65) Prior Publication Data

US 2015/0254135 A1    Sep. 10, 2015

(51) Int. Cl.
*G06F 11/10* (2006.01)
*G06F 13/28* (2006.01)
*G11B 20/18* (2006.01)

(52) U.S. Cl.
CPC ............ *G06F 11/1076* (2013.01); *G06F 13/28* (2013.01); *G11B 20/1833* (2013.01)

(58) Field of Classification Search
CPC ............ G06F 11/1068; G06F 12/0246; G06F 11/1076; G06F 13/28; G11C 16/10; G11C 16/26; H03M 13/1102; H03M 13/6331; H03M 13/4138
USPC ................................ 714/766, 770; 360/31, 53
See application file for complete search history.

(56) References Cited

U.S. PATENT DOCUMENTS

| | | |
|---|---|---|
| 6,275,965 B1 | 8/2001 | Cox et al. |
| 6,891,690 B2 | 5/2005 | Asano et al. |
| 7,362,529 B2 | 4/2008 | Chiao et al. |
| 7,490,212 B2 | 2/2009 | Kasiraj et al. |
| 7,529,966 B2 | 5/2009 | Cochran et al. |
| 7,570,445 B2 | 8/2009 | Alfred et al. |
| 7,589,925 B1 | 9/2009 | Chiao et al. |
| 7,639,447 B1 | 12/2009 | Yu et al. |
| 7,663,835 B1 | 2/2010 | Yu et al. |
| 7,706,096 B2 | 4/2010 | Ito et al. |

(Continued)

OTHER PUBLICATIONS

Haratsch, E.F.; Mathew, G.; Jongseung Park; Ming Jin; Worrell, K.J.; Yuan Xing Lee, "Intertrack Interference Cancellation for Shingled Magnetic Recording," Magnetics, IEEE Transactions on , vol. 47, No. 10, pp. 3698,3703, Oct. 2011.*

(Continued)

*Primary Examiner* — Cynthia Britt
(74) *Attorney, Agent, or Firm* — G. Marlin Knight (57) ABSTRACT

Data storage devices are described with an ECC system that generate additional on-demand ECC information for a previously written track to provide for correction of data errors in the track and thereby avoid having to rewrite the track. Embodiments of the invention address the squeeze-error problem that arises when writing the next (second) track in a sequence causes errors to be introduced in the adjacent previously written (first) track. In alternative embodiments the existence of the data errors in the first track can be detected by reading the track or by estimating the number of likely errors using head position data measured while writing the first and second tracks. The additional on-demand ECC information can be written on any track that is available.

20 Claims, 7 Drawing Sheets

(56) References Cited

U.S. PATENT DOCUMENTS

| | | |
|---|---|---|
| 8,209,471 B2 | 6/2012 | Yano et al. |
| 8,225,047 B2 | 7/2012 | Yano et al. |
| 8,276,043 B2 | 9/2012 | Yano et al. |
| 8,375,274 B1 * | 2/2013 | Bonke .......................... 714/770 |
| 8,699,162 B1 * | 4/2014 | Grobis et al. ................... 360/48 |
| 8,856,618 B2 * | 10/2014 | Akiyama et al. ............. 714/763 |
| 2003/0061552 A1 * | 3/2003 | Su et al. ....................... 714/708 |
| 2005/0071537 A1 | 3/2005 | New et al. |
| 2006/0039246 A1 | 2/2006 | King et al. |
| 2006/0041789 A1 | 2/2006 | Cochran et al. |
| 2010/0095181 A1 | 4/2010 | Ma et al. |
| 2011/0075292 A1 | 3/2011 | New et al. |
| 2011/0096828 A1 | 4/2011 | Chen et al. |
| 2012/0303930 A1 * | 11/2012 | Coker et al. .................. 711/207 |
| 2013/0148225 A1 * | 6/2013 | Coker et al. ................... 360/31 |
| 2014/0055881 A1 * | 2/2014 | Zaharris ......................... 360/55 |
| 2014/0101515 A1 * | 4/2014 | Akiyama et al. ............. 714/763 |
| 2015/0128008 A1 * | 5/2015 | Chatradhi et al. ............ 714/766 |

OTHER PUBLICATIONS

Chooruang, K.; Aziz, M.M., "Experimental studies of shingled recording using contact recording test system," Electrical Engineering/Electronics, Computer, Telecommunications and Information Technology (ECTI-CON), 2013 10th International Conference on, vol., no., pp. 1,5, May 15-17, 2013.*

* cited by examiner

ERROR CORRECTION WITH ON-DEMAND PARITY SECTORS IN MAGNETIC DATA STORAGE DEVICES

Related Applications

The subject matter of the present application is related to the subject matter of application "SCALABLE REPAIR BLOCK ERROR CORRECTION FOR SEQUENTIAL MULTIPLE DATA BLOCKS IN A MAGNETIC DATA STORAGE DEVICE" bearing Ser. No. 13/645,309 with a filing date of Oct. 4, 2012, which issued as U.S. Pat. No. 8,856,618 and which is hereby incorporated by reference.

The subject matter of the present application is also related to the subject matter of co-pending application "TRACK-BAND SQUEEZED-SECTOR ERROR CORRECTION IN MAGNETIC DATA STORAGE DEVICES" bearing Ser. No. 14/072,923 with a filing date of Nov. 6, 2013, which was published as U.S. Pat. App. 2015/0128008 on May 7, 2015.

FIELD OF THE INVENTION

Embodiments of the invention relate to error correction techniques in magnetic data storage devices.

BACKGROUND

Conventional disk drives with magnetic media organize data in concentric tracks that are spaced apart. The concept of shingled writing is a form of magnetic recording and has been proposed as a way of increasing the areal density of magnetic recording. In shingle-written magnetic recording (SMR) media a region (band) of adjacent tracks are written so as to overlap one or more previously written tracks. SMR recording technology assumes that the effective writing path of the write head is wider than the track pitch. The shingled tracks must be written in sequence unlike conventionally separated tracks, which can be written in any order. Shingled-tracks on an SMR disk surface are organized into a plurality of shingled regions, which are also called I-regions. Once written in the shingled structure, an individual track or sector cannot be updated in place, because that would overwrite and destroy the overlapping tracks. SMR drives can also include non-shingled regions that are written in non-overlapping structure so that individual tracks and sector can be updated in place, which is convenient for staging some data records before they are written to a shingled region. So-called E-regions (exception regions) are used for short term storage, caching or staging data that will ultimately be written to a shingled region. SMR drives rely on indirection mapping that to links logical block addresses (LBAs) to physical block addresses (PBAs). For example, when a data sector corresponding to a particular LBA is moved from an E-region to an I-region, the indirection mapping is updated.

ECC in disk drives is used to detect and correct errors and erasures, which occur when a data element is missing or known to be faulty. Traditionally ECC is performed on a sector basis using redundant bits appended to the sector data when it is written. Simple error detection capability for each sector can be achieved by including check symbols appended to the data in each sector. These sector ECC approaches are not ideal for some disk drive applications such as streaming audio-video (AV) and the SMR architecture presents additional ECC problems.

US patent application 20110075292 by Richard New, et al. (Mar. 31, 2011) describes SMR drives in which a band establishes a respective segment in a log-structured file system. Large error correction (ECC) block sizes within each segment (band) are implemented by storing the intermediate ECC parity state after each partial write of an ECC block. In this case, the ECC block size spans multiple physical sectors, and because of the larger ECC block size the error correction code is more efficient and able to correct larger defect errors on the disk. The ECC code may be implemented in a number of different ways which are known to those skilled in the art of designing ECC codes.

U.S. Pat. No. 7,490,212 to Kasiraj, et al. (Feb. 10, 2009) describes ECC for an SMR drive that is useful for recording and playback of video data in transaction data blocks larger than the conventional 512 byte block size but smaller than the band size. Large physical sectors can be used to improve format efficiency, and large ECC codeword sizes (larger than the transaction block size) can be used to improve reliability without imposing a read-modify-write performance on the system. To do this, the disk drive saves the cumulative ECC parity state between successive partial writes of each transaction block so that the parity computed in a first write operation is used to generate the parity for a subsequent write operation. For example, a transaction block size might be one megabyte, and the ECC might span the entire band. Each time a transaction block is written, gradually filling up the band, the cumulative parity state for the ECC is maintained, so that at the end of the last transaction block in that band, the ECC parity can be written out. This provides a very long ECC block size and therefore a very efficient ECC code which is resilient to defects and errors. The ECC code could be very simple, such as a single parity sector computed by XORing all of the data in the physical sectors in the band. This provides protection against a single sector failure within the band. However, using XORing the error correction block is a parity sector that can only correct one data block and is not scalable.

Published patent application 20110096828 (Apr. 28, 2011) by Ying Chen, et al. describes a system with encoding and decoding blocks with multiple independent scalability layers. The Forward Error Correction (FEC) is assumed to be applied to a "block" or "fragment" of data at a time, i.e., a "block" is a "source block" for FEC encoding and decoding purposes. A client device can use the segment indexing described herein to help to determine the source block structure of a segment. The FEC codes considered for use with block-request streaming are typically systematic FEC codes, i.e., the source symbols of the source block may be included as part of the encoding of the source block and thus the source symbols are transmitted. A systematic FEC encoder generates, from a source block of source symbols, some number of repair symbols and the combination of at least some of the source and repair symbols are the encoded symbols that are sent over the channel representing the source block. Some FEC codes may be useful for efficiently generating as many repair symbols as needed, such as "information additive codes" or "fountain codes" and examples of these codes include "chain reaction codes" and "multi-stage chain reaction codes". Other FEC codes such, as Reed-Solomon codes may practically only generate a limited number of repair symbols for each source block.

Hard disk drive (HDD) archival applications such as so called "cold-storage" refer to data that is stored for various reasons but is rarely ever read again. For these applications the HDD design tradeoffs between density of storage, access speed, etc. are different than for HDDs used for data that is frequently read. Shingled Magnetic Recording (SMR) designs are particularly suitable and cost effective for cold storage. HDD archival applications such as "cold-storage" require increased capacities, which are obtained by increasing the tracks per inch (TPI). Data integrity that guarantees accurate data retrieval is also a requirement. These are conflicting requirements, because TPI increases by squeezing the width of the tracks, which invariably results in increasing the number of unreadable data sectors. For example, writing a second track in a sequence can narrow the magnetic width of portions of the first adjacent track so that these portions are no longer readable. This type of error is known as a squeeze-error and "squeezed sectors" are equivalently "erased sectors."

SUMMARY OF THE INVENTION

Embodiments of the invention generate additional on-demand ECC information for a previously written track to provide for correction of data errors in the track and thereby avoid having to rewrite the track. Embodiments of the invention address the squeeze-error problem that arises when writing the next (second) track in a sequence causes errors to be introduced in the adjacent previously written (first) track. In alternative embodiments the existence of the data errors in the first track can be detected by reading the track or by estimating the number of likely errors using head position data measured while writing the first and second tracks. The additional on-demand ECC information can be written on any track that is available, but it can be advantageous to write it in a dedicated track remotely located in an area of the disk that is less prone to errors. The drive system must maintain linking information in order to know if additional on-demand ECC information exists for a particular track and where it is stored, which can be achieved by enhancing the standard indirection mapping that links LBAs to PBAs.

Embodiments of the invention include a two-level ECC system, which uses a fixed number of parity sectors for a first track level ECC capability in addition to parity sectors for the on-demand track ECC system. Embodiments of the invention detect or estimate the number of data sectors lost when the adjacent second track is written, then generate a number of "on-demand" parity sectors (using the original data for the track stored in memory) that is equal to or greater than the number required to allow recovery of the known errors. These on-demand parity sectors are stored on a separate track. The mathematical algorithms used for the first fixed level and the on-demand level can be the same with the on-demand level supplying additional parity sectors and, therefore, additional correction capability. For example, a first track level ECC capability can generate a first set of $R_1$ parity sectors for each written track, where of $R_1$ is fixed number selected as part of the design. The first set parity sectors is written on each track along with the user data. For tracks that are determined to require additional parity sectors, the on-demand ECC system, then dynamically generates and writes the required ("demanded") additional ECC information (e.g. a second set of $R_2$ parity sectors) on another track that allows the ECC system to recover the entire track even with the known errors. Reserve ECC capability for the tracks can optionally be implemented in addition to the "demanded" minimum track ECC capability. Because the on-demand set of $R_2$ parity sectors is only written for a relatively small subset of tracks in an exemplary embodiment, it can be significantly larger than the first set of $R_1$ parity sectors. The resulting on-demand correction capability result of $R_1+R_2$ sectors can be significantly greater than $R_1$, without having to store the $R_2$ parity sectors for every track.

Embodiments of the invention can be particularly advantageous in any magnetic data storage device that is designed for efficiently writing data on complete tracks sequentially for a substantial amount of the drive's capacity and handling non-sequential track and short writes (i.e. less than a whole track) as exceptions. Thus, Shingled Magnetic Recording (SMR) drive embodiments are described, but embodiments can be implemented in drives with conventional heads and track organization. In particular, drives designed for "cold storage" can advantageously use embodiments of the on-demand ECC system.

In various embodiments, the number of squeezed data sectors errors can either be estimated using a method such as the Delta-PES method described below or the data sectors errors can be detected directly by a read-back method. In one embodiment a first track (Track-1) is read-back after the subsequent adjacent overlapping second track (Track-2) has been written. The sector errors on shingle-written Track-1 are detected using the system's track-level error detection capability using the redundant information, which includes the set of $R_1$ parity sectors, written on each track along with the data. In an embodiment the on-demand track ECC process can use the erased sector count supplied a sector metadata-symbol erasure-correction-code such as the Media-Error Detection Code (MEDC) described in the related application. The trigger for the on-demand track ECC process can include a reserve correction capacity requirement.

As an alternative to reading back the previously written track, applicants describe a Delta-PES method that estimates track squeeze by comparing the sets of Position Error Signal (PES) values recorded when writing Track-1 and Track-2 to determined when Track-1 has probably been squeezed. The resulting estimated number of servo sectors squeezed is then used to calculate the number of on-demand parity sectors to generate.

In embodiments of the invention, the on-demand track ECC process is designed to efficiently use the hardware components that are used by the first track level ECC to generate the first set of parity sectors. The original data for Track-1 is still stored in the memory, e.g. in a DRAM-Buffer for use by the on-demand system. The number of erased sectors in Track-1 caused by having written Track-2 is known or has been estimated at this point. This determines the number of additional parity sectors "demanded" for Track-1. The described embodiments assume that the system has both DRAM and SRAM memory and that efficient use of these inherently limited resources is desirable. The limited amount of SRAM memory used by the first level ECC can be reused for each iteration of the on-demand processing loop by transferring the generated subset of parity sectors to the DRAM. One method uses programmable Direct Memory Access to transfer the generated data between SRAM and DRAM. The Track-1 data stored in the DRAM buffer is accessed as needed. The end result is the set of on-demand parity sectors, that is mathematically capable of recovering all the erased sectors in Track-1 (plus optional reserve capacity for additional erasures, if desired).

The decoding process follows logically from the definition of the encoding scheme. The first level ECC system can process tracks and correct errors within its capability using the parity sectors on the track. The second level on-demand ECC system only needs to be invoked when the first level ECC system cannot correct the errors. The on-demand system requires the retrieval of the remotely written on-demand parity sectors. The second level error correction process can then use the parity sectors that are written on the track in combination with the addition on-demand parity sectors written on the separate track to perform error correction up to the capability provided by the total set of parity sectors. Should the errors exceed the correction capability, then the track is declared unreadable.

DETAILED DESCRIPTION OF THE INVENTION

Statistical test data on squeeze-errors suggests that within a selected band of adjacent tracks the number of "bursty tracks" in which the number of squeezed sectors exceeds an average number, is relatively small. This empirical evidence suggests that a Squeezed Sector Erasure Correction Scheme, that calculates Track Parity Sectors within a selected Track to correct a large number of "Squeezed Sectors" read error in a limited number of "Bursty-Tracks" can solve the problem of both guaranteeing required data retrieval reliability, as well as increasing capacity by allowing narrower tracks that result in some squeezed data errors. The empirical data suggests that embodiments of such a scheme according to the invention will permit 20% TPI capacity gain at the expense of less than 2% additional parity sector overhead, which includes track-parity sectors added "on-demand".

In embodiments of the invention in addition to the fixed first level ECC capability for error correction in a single track, embodiments of the invention can include a second level on-demand ECC which uses additional parity sectors to correct for errors in a written track that exceed the fixed ECC capability for tracks. The additional parity information is written on another track that is preferably dedicated to on-demand parity sectors. In Shingled Magnetic Recording (SMR) disk drives, sequential logical blocks of user data are generally written in sequential physical tracks in shingled regions, so an ECC system that covers an entire track according to the invention is practical without incurring a large performance penalty.

Embodiments of the invention are particularly useful in cold-storage applications by a) helping to achieve a specified hard-error rate data recoverability in cold-storage devices, and b) increasing the sector erasure correction capability in the presence of "aging" and adjacent track interference (ATI) and far track interference (FTI) which can cause track squeeze propagation. In embodiments of the invention data capacity can be significantly increased by increasing tracks per inch with the extra ECC protection blocks taking up only an additional small fraction of capacity, for a net data increase.

Embodiments of the invention add on-demand parity sectors to "bursty tracks" in which the number of unreadable squeezed sectors exceeds the fixed track ECC correction capability. This on-demand approach is better than providing all individual tracks with a maximum number of parity sectors, which are not needed for most tracks and would reduce capacity unnecessarily.

Embodiments of the invention can use any appropriate mathematical algorithms that provide for error correction using redundant parity information. The related applications referenced above include a description of a track level, sector-based ECC scheme that can be used with the present invention. An algebraic solution for embodiments of the invention integrates the sector data in a track by using a Cauchy-Matrix Parity Sector Encoder to generate "Track Parity Sectors". This is a structured matrix, such that the encoder/syndrome-generator and decoder are implemented using iteratively calculated Programmable-Multipliers and SRAM-Storage Accumulators, that are used in SMR hard disk controller (HDC) implementations. Note that standard Reed-Solomon (RS) code shift-register implementation is unacceptable for this application.

The implementation of one embodiment of the invention uses programmable Cauchy Matrix generators and SRAM parity sector data storage implemented in hardware in the hard disk controller (HDC). In the fixed first level track ECC, $R_1$ parity sectors per track are implemented to provide for restoration of $R_1$ squeezed data sectors in each track. The number of fixed parity sectors $R_1$ is determined during the design process for the disk drive. In the dynamic on-demand ECC, an additional set of $R_2$ parity sectors, will be made flexibly available to be used in any bursty track to provide for recovery of $(R_1+R_2)$ squeezed/erased data sectors, where $R_2$ can vary based on the detected or estimated errors determined after a track has been written and the adjacent track in the sequence has been written.

Figure 1:
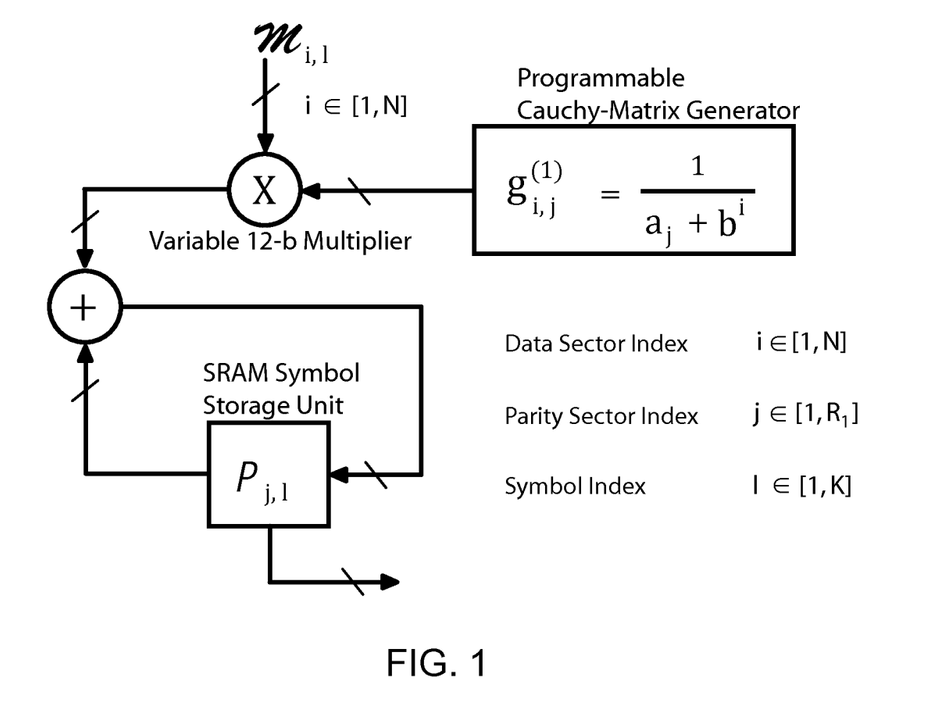
FIG. 1 is a block diagram illustrating a track encoder according to an embodiment of the invention.

The implementation of an embodiment of the invention will now be described. FIG. 1 is a block diagram illustrating a first level track encoder according to an embodiment of the invention as described below. The track-level $R_1$-parity, N-sector track programmable multiplier operates as follows:

$$P_{j,l} = \Sigma_{i=1}^{N} g_{i,j}^{-1} m_{i,l}, G = [g_{i,j}^{-1}]$$

Fix l symbol index, then sum over i sector index to generate l-th symbol of j-th parity sector for the track.

Iteratively calculate (cumulatively store in SRAM):

$$P_j = [P_{j,l}] l = 1, \ldots, K, j\text{-th parity sector.}$$

Index Ranges are defined as:
  Parity Sector Index $j \in [1, \ldots, R_1]$
  Sector Index $i \in [1, \ldots, N]$
  Symbol Index $l \in [1, K]$;
  where K is number of symbols in a parity sector An exemplary embodiment, as further described below, can have $R_1=4$ with 4 SRAMs which each holding a set of K symbols (12 bits each) for a parity sector and allowing efficient calculation of the first level parity sectors for each track.

The operation of the 4K sector Cauchy-Matrix encoder embodiment over Galois field $GF(2^{12})$ is described as follows:

$$GF^*(2^{12}) = \{z^k\}, k \in [1, 2^{12} - 1],$$
$$z \mid z^{12} + z^6 + z^4 + z + (1 :: GF(2))$$
$$\text{First-Level } G_1 = \frac{1}{a_j + b^i}, \text{rank} - (G_1) = R_1$$
$$a_j = z^i, j \in [1, R_1] - \text{Row Index},$$
$$b = z^{499}, i \in [1, N] - \text{Column Index}$$

Figure 4:
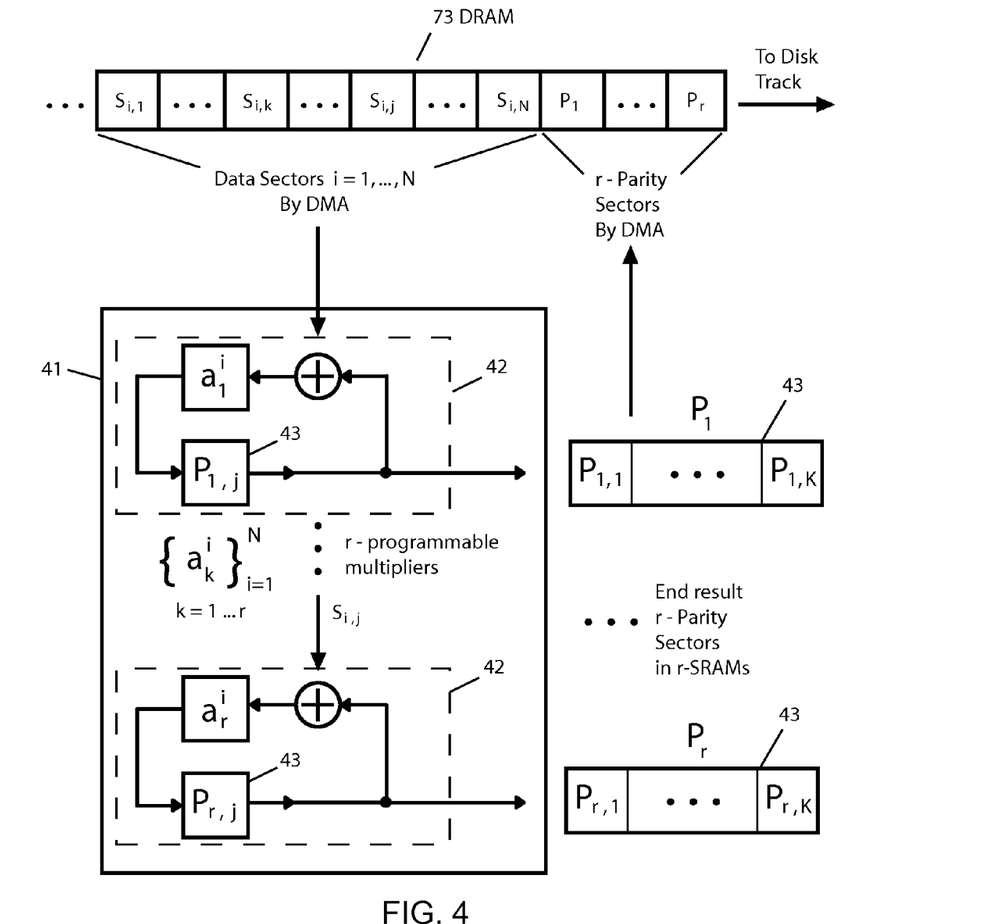
FIG. 4 illustrates the block structure of encoder/syndrome generator that generates r-parity sectors according to an embodiment of the invention.

FIG. 4 illustrates the block structure of encoder/syndrome generator 41 that generates r-parity sectors according to an embodiment of the invention. The encoder/syndrome generator 41 includes r-programmable multiplier units 42 that each generate a parity sector. Each multiplier unit 42 includes an SRAM 43. As will be further described below, embodiments of the invention use the encoder/syndrome generator 41 for both the first level ECC and the second level on-demand ECC system.

A first level ECC system embodiment as described above has a selected fixed ECC capability on each track when implemented, even though the level of capability that is selected can vary between implementations. The on-demand track ECC system described herein provides SMR drives the ability to detect and respond to squeeze errors created during the shingle-writing process by implementing a variable ECC capability.

One embodiment of the on-demand ECC system enhances the writing process for sequential tracks to first detect squeeze errors on a previously written track (which will be called "write next, verify previous") and then dynamically write the required ("demanded") additional ECC information (on another track) that allows the ECC system to recover the entire track. The additional ECC information is organized in integral numbers of parity sectors which are the same size as the user data sectors. As described below, there can be multiple the data sectors in each servo sector. The parity sectors can be advantageously written in a dedicated track region that is remotely located in an area of the disk that is known to be less prone to squeeze errors. The system must maintain linking/mapping information in order to know if additional ECC information exists for a track and where it is stored. The standard Indirection Table scheme can be modified accordingly to record the linkages.

Figure 2:
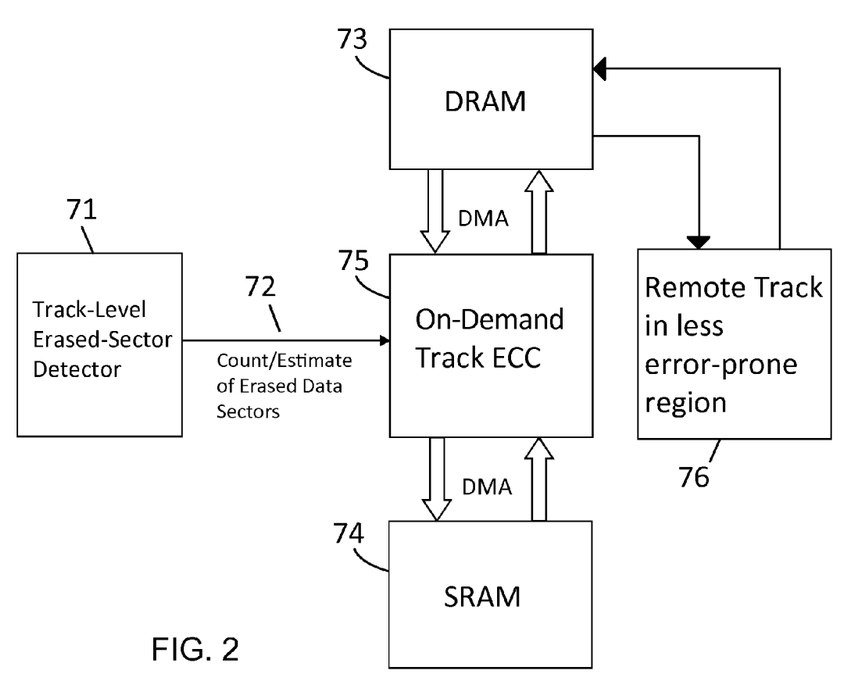
FIG. 2 is a block diagram illustrating an on-demand track encoder system according to an embodiment of the invention.

FIG. 2 is a block diagram of a system including an on-demand track ECC encoder 75 according to an embodiment of the invention. When triggered the dynamic on-demand track ECC process uses the count or estimate of erased sectors 72 supplied by the track-level erased-sector detector 71. The on-demand encoding process requires some method of dynamically determining the number of additional parity sectors that are to be generated. Two embodiments of detector 71 are described in more detail below. In general, one embodiment uses the "write next, verify previous" method, which reads the previously written track and uses the Media-Error Detection Code (MEDC) to detect erased data sectors on the track according to the principles described herein and in the related applications. Another embodiment uses the Delta-PES method to generate an estimated number of erased data sectors without requiring the reading of the previously written track.

The method of operation will be described with reference to two adjacent tracks, which for simplicity are the first two tracks in an SMR shingled track region, but a practical implementation will iteratively continue to process a large number of tracks in sequence. The original data for Track-1 is still stored in the memory, e.g. in DRAM-Buffer 73. The embodiment has both DRAM (Dynamic Random Access Memory) 73 and SRAM (Static Random Access Memory) 74. Efficient use of the limited SRAM resources is desirable both for cost factors. The additional ECC information is advantageously written in a remote track 76 remotely located in an area of the disk that is less prone to squeeze errors. A region of the disk can be dedicated for storage of these on-demand track parity sectors. Although the number of on-demand parity sectors is preferably variable, an implementation can have a system imposed maximum, which simplifies the design.

Figure 3:
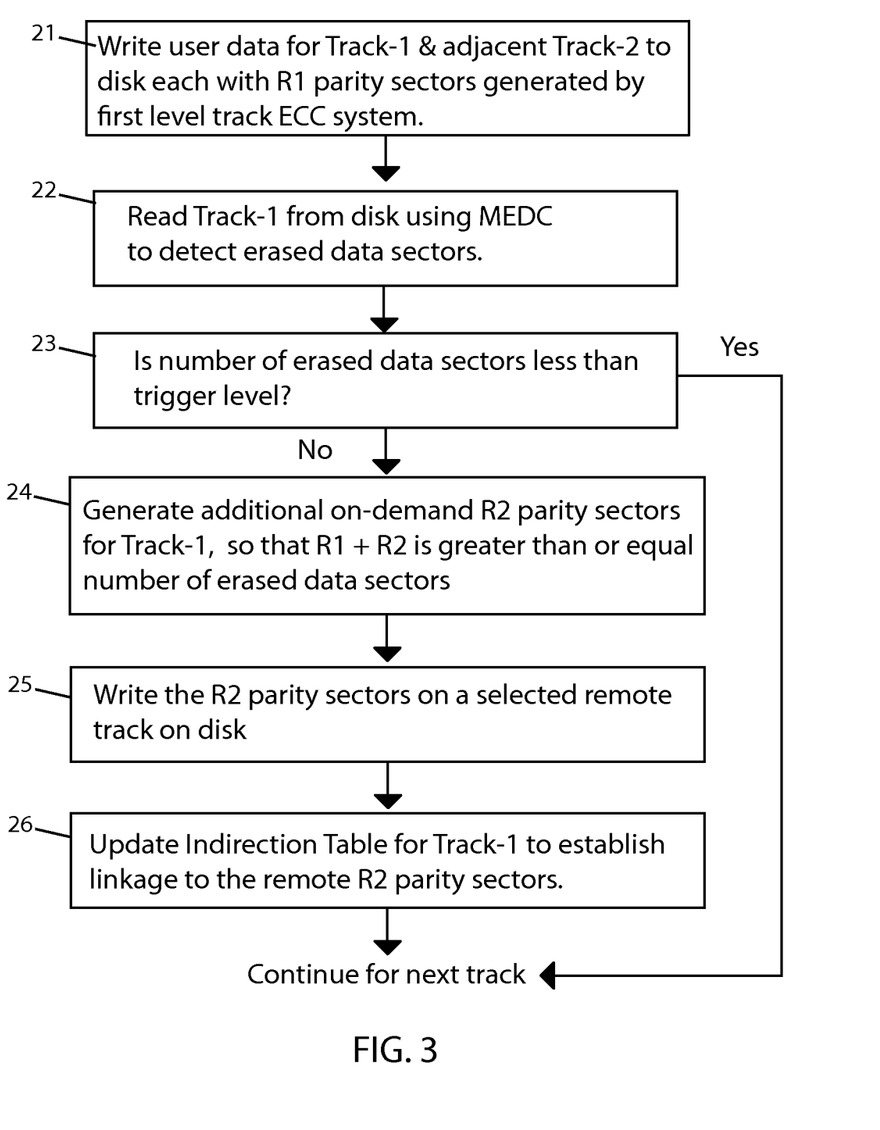
FIG. 3 is a flowchart illustrating a method using read back after shingled-writing (shingle-write verify) to detect erased sectors with an on-demand track encoder system according to an embodiment of the invention.

FIG. 3 is a flowchart illustrating a method using read back to detect erased sectors with an on-demand track encoder system according to an embodiment of the invention. The user data for the first track (Track-1) and the adjacent second track (Track-2), which can be shingled/overlapping) is written to the disk along with the $R_1$ parity sectors generated by the first level ECC system for each track 21. Embodiments of the writing process dynamically detect erased sectors in Track-1 after the subsequent adjacent second track (Track-2) has been written. The complete set of sectors on Track-1 are read back from the disk along with the check symbols and parity sectors that have been generated and written for use by the first level ECC system. An embodiment can detect erased data sectors using the Media-Error Detection Code (MEDC) capability described in application titled "SCALABLE REPAIR BLOCK ERROR CORRECTION FOR SEQUENTIAL MULTIPLE DATA BLOCKS IN A MAGNETIC DATA STORAGE DEVICE" bearing Ser. No. 13/645,309. The MEDC code is a sector metadata-symbol erasure-correction-code. Each sector of user supplied data is written to the track as an media-ECC codeword which includes check symbols calculated from the user data, which allows detection of erasures. The result is the number of erased data sectors on Track-1 22. The number of erased sectors is then compared to a trigger threshold value 23. If the errors are less than the trigger threshold value, then no on-demand parity sectors are required, so the writing process continues to the next track and the variables are in effect updated with Track-2 taking on the role of Track-1 in the simplified example.

If the number of erased sectors is equal to or greater than the trigger threshold value, then the dynamic on-demand ECC process is executed. If the fixed-track ECC system is able to recover all of the sectors of data on Track-1, then in some embodiments no additional on-demand ECC information will be generated. However, it may be desirable to ensure that the first level ECC system is not exhausted by the known errors and, therefore, has no ability to correct additional errors that may be caused by "aging" and "squeeze-propagation." Therefore, embodiments can ensure reserve ECC capacity by generating additional track band ECC information if the known, correctable errors in Track-1 reduce the reserve correction capacity below a threshold value.

As an example, assume that the tracks are written with $R_1$ parity sectors. After Track-1 and Track-2 have been written to two adjacent physical tracks on the disk, Track-1 is read with the MEDC detector enabled to detect the number of sectors with squeeze errors $E_i$. The on-demand ECC system generates $R_2$ additional on-demand parity sectors using the original data for Track-1, which is still stored in memory 24. The number of additional parity sectors is selected so that $R_1+R_2$ is equal to or greater than number of sectors with squeeze errors $E_i$. This allows the system recovery all of the original data for Track-1 using the readable data from the disk for Track-1 despite the known errors. This avoids having to declare the Track-1 area of the disk unusable and having to rewrite the data on another physical track. The additional on-demand parity sectors are written to another selected track, which is preferably in a dedicated on-demand parity region 26. The system's Indirection Table is updated to establish the correct association/linkage between Track-1 and the corresponding on-demand parity sectors. The standard Indirection Table in an SMR drive maps logical addresses to physical addresses.

If $E_i$ is less than or equal to $R_1$, then the errors are within the correction capability of the first level ECC and no additional correction is demanded. However, as noted, if $E_i$ is equal to $R_1$, then there is no reserve margin for additional errors. Therefore, the trigger threshold for on-demand parity sectors can be selected to be less than $R_1$. If the embodiment limits on-demand parity sectors to a fixed maximum value, e.g. Max_$R_2$, and if errors $E_i$ are greater than or equal to $R_1$+Max_$R_2$, then Track-1 should be declared to be unusable and marked accordingly in the system's records. In this case the data for Track-1 must be rewritten on another physical track, which can be the adjacent track and the data for Track-2 can be rewritten on the following track.

Figure 5:
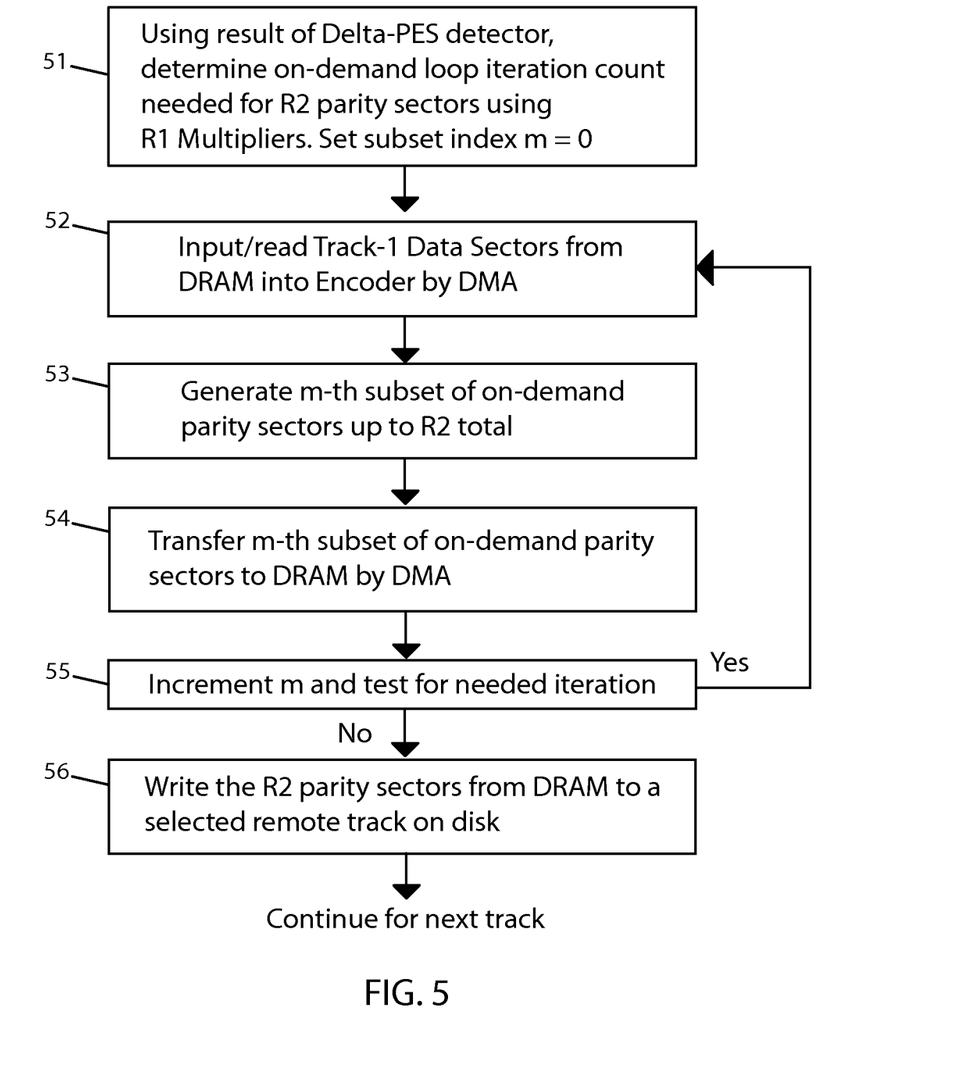
FIG. 5 is a flowchart illustrating a method using the encoder/syndrome generator with a fixed number of multipliers to generate the on-demand parity sectors according to an embodiment of the invention.

FIG. 5 is a flowchart illustrating a method using the encoder/syndrome generator 41 with a fixed number of multipliers 42 as shown in FIG. 4 to generate the on-demand parity sectors according to an embodiment of the invention. Embodiments of the invention can use the encoder/syndrome generator 41 for both the first level ECC and the second level on-demand ECC system. Once the number of erased sectors in Track-1 is known by use of Delta-PES detection this determines the number of additional parity sectors "demanded" for Track-1 and, therefore, the iterations of the loop 51. A limited number of multipliers with SRAM memory, selected for optimal use by the first level ECC system, can be reused by the on-demand ECC system for each iteration of the calculation loop by transferring the generated sectors to the DRAM 52. The same hardware utilization scheme can be used for syndrome generation during the decoding process. As an example, the each of the Cauchy-Matrix multipliers with SRAM can be used to iteratively calculate one parity/syndrome sectors per DRAM read. For efficient operation the number of SRAMs can be equal to the number of parity sectors $R_1$ generated for each track. The SRAM contents can be efficiently transferred by DMA to the DRAM in each iteration. (Direct Memory Access (DMA) refers to a method of transferring data between memory locations without using the microprocessor.)

The Track-1 data stored in the DRAM buffer is accessed as needed. The process can be repeated for the next set of required Parity Sectors/Syndrome Sectors. The result is a set of Parity Sectors/Syndrome Sectors, that is mathematically capable of recovering all the erased sectors in Track-1 (plus optional reserve capacity for additional erasures). Upon completion of the encoding calculation, the set of Parity Sectors are transferred by free memory write (FMW) transfer from DRAM to the relaxed track 76.

As a specific example, assume that the fixed first level track ECC implementation has 4 SRAMs, 4K-bytes each available, which are used to efficiently calculate 4 parity sectors for every track. Further assume the estimated or detected squeezed data sectors in Track-1 are 12 erased 4K-sectors. Therefore, eight more parity sectors minimum are needed, which is the assumed amount of "ECC-on-Demand" in this example, i.e. two iterations 51. To do this with the available 4-SRAM, the method reads through the Track-1 data in DRAM twice 52, each iteration generates 4-Parity Sectors 53, using the 4 SRAMs and transfers them to DRAM by DMA 54. The loop index is incremented and the end condition is tested 55. At the end the method has calculated 8 additional Parity Sectors for Track-1, which are transferred from DRAM to a selected track in a dedicated parity region on the disk 56. The track and sector addresses of these parity sectors will be stored in an Indirection Table with appropriate linkage to Track-1 as previously described.

The normal reading/decoding process follows logically from the definition of the encoding scheme. All recoverable tracks can be read independently of each other. The Indirection Table gives the PBAs where the additional parity sectors are stored for the LBAs. The first level track ECC operates to provide correction for the number of errors within its capability. If the errors exceed the first level capability, then on-demand track ECC uses the entire set of parity sectors, both first level $R_1$ and second level on-demand $R_2$, to correct $R_1$+$R_2$ data sectors. If errors $E_i$ are greater than or equal to $R_1$+$R_2$, then Track-1 should be declared to be unrecoverable.

In this embodiment the set of Parity Sectors/Syndrome Sectors are transferred by programmable Direct Memory Access (DMA) transfer into DRAM. The programmable Cauchy-Matrix multipliers are used iteratively to generate the Decoder Matrix Rows. Each squeezed sector is recovered by an "intermitted" DRAM read of the Syndrome Sectors. Each XOR-ed block update can be DMA transferred to DRAM and XOR-ed with previous update to produce a recovered squeezed sector at the end of a complete Syndrome-Sector DRAM read.

Using PES Values for Squeezed Sector Estimation

As an alternative to the shingle-write verify approach described above, an alternative embodiment can obtain an estimate of the likely number of squeezed servo sectors by recording and then comparing the corresponding position error signal (PES) during the writing of adjacent tracks (Track-1 & Track-2). The method uses the delta between the PES values measured for adjacent servo sector identifiers (SIDs) as a proxy that can indicate when it is likely that the data for Track-1 has been rendered unreadable by being squeezed, i.e. over written the adjacent data on Track-2. Estimating the number of squeezed sectors using the delta between the PES values can be performed much more efficiently than doing a read back. The number of squeezed sectors can be converted into a corresponding number of data sectors by multiplying by the ratio of the data sectors per SID for the track, which is determined by the zone in which the track is located. Each squeezed data sector, then requires a corresponding parity sector as described above. The Delta-PES method produces an estimate, which should be "calibrated" by performing experiments on a particular disk drive design to determine a threshold that should be applied to the delta PES values, as well as, any additional uplift or buffer margin of parity sectors that should be added to cover erroneously low estimates.

Figure 6:
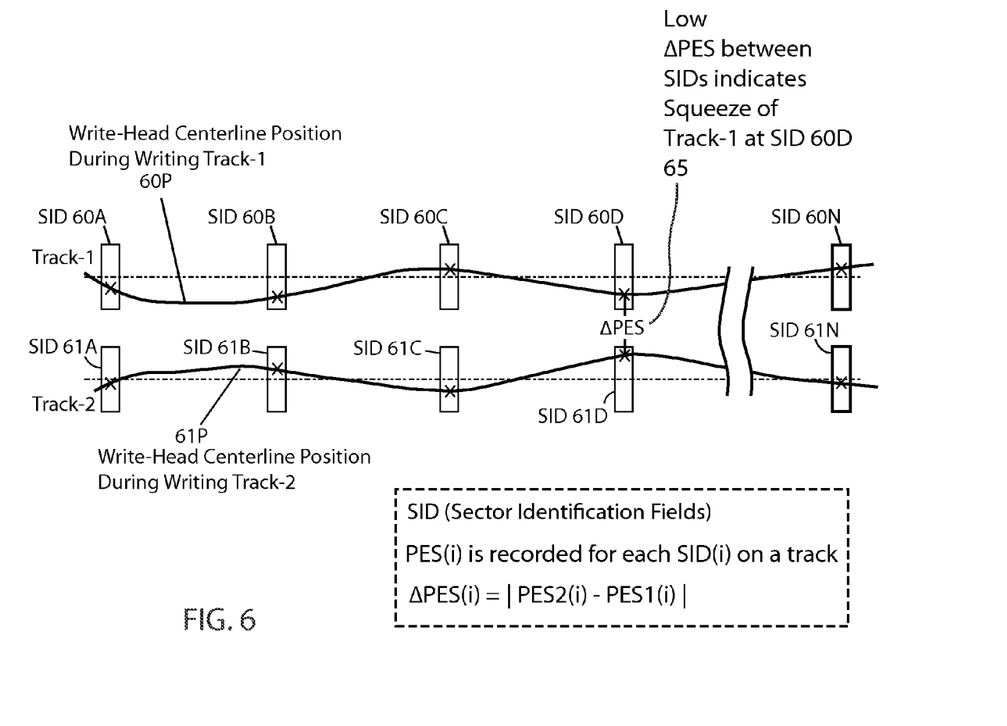
FIG. 6 is a graphical illustration of a method of using Position Error Signal (PES) values to estimate a number of on-demand parity sectors required for a shingled track according to an embodiment of the invention.

FIG. 6 is a graphical illustration of a method of using Position Error Signal (PES) values to estimate a number of on-demand parity sectors required for a shingled track according to an embodiment of the invention. Only small section of two adjacent tracks are shown. The write head centerline path 60P for Track-1, which is written first, is illustrated as the wavy line which passes through each SID 60A-D, 60N at slightly different positions with respect to the ideal track centerline illustrated by the broken line. The write head centerline path 61P for Track-2, which is written second, is illustrated as the wavy line which passes through each SID 61A-D, 61N at slightly different positions with respect to the ideal track centerline illustrated by the broken line. The actual width of the data written by the magnetic field (not shown) of the write head is wider than the centerline path.

When the slider containing the read and write heads passes over the SIDs, the read head is enabled to read the information in the SID, which includes the PES signal. The PES signal is read as an analog voltage which is digitized and saved in memory for further processing. The embodiment of the method uses the absolute value of the difference between the comparable PES values (ΔPES) for the tracks as an indication of the distance 65 between the centerlines as illustrated between SID 60D and SID 61D and inferentially the probability of squeezed data around the SID in Track-1. In this example, the ΔPES and distance 65 are intended to represent a squeezed sector error. The actual ΔPES and distance 65 that would indicate a squeeze error should be determined empirically for a particular disk drive design.

Figure 7:
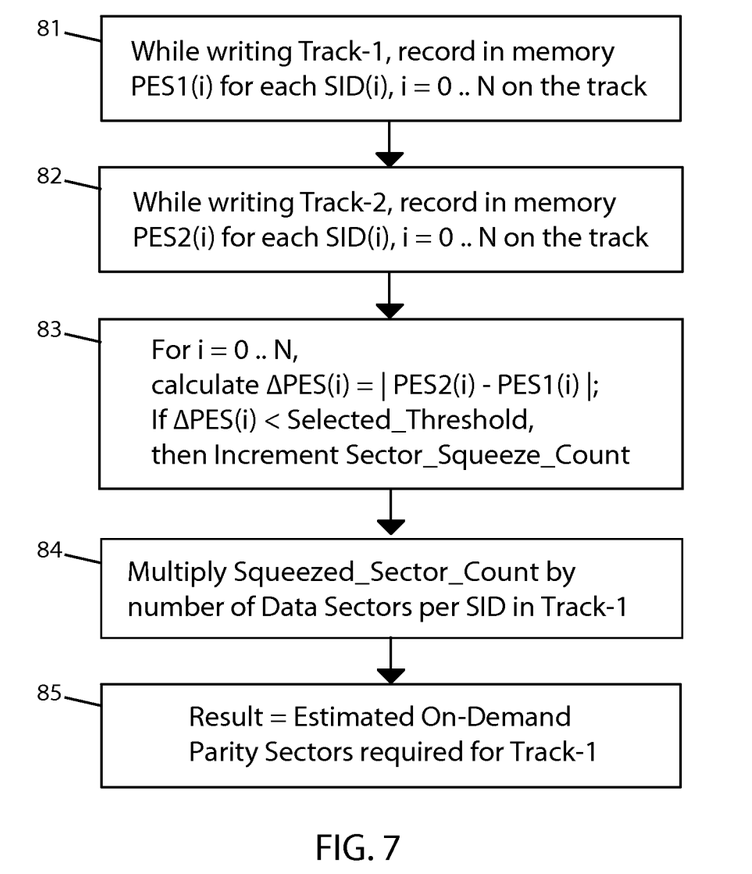
FIG. 7 is a flowchart illustrating a method of using Position Error Signal (PES) values to estimate a number of on-demand parity sectors required for a shingled track according to an embodiment of the invention.

FIG. 7 is a flowchart illustrating a method of using Position Error Signal (PES) values to estimate a number of on-demand parity sectors required for a shingled track according to an embodiment of the invention. Only one iteration is shown, which calculates the number of on-demand parity sectors required for Track-1. The method can be applied to any number tracks by iterating with appropriate adjustment of the variables. While Track-1 is being written, the PES1(i) value measured at each SID(i) and saved in memory 81. In a typical disk drive the PES values are measured and saved for a few SIDs, but this embodiment requires that the set of PES values be saved for the entire track. As described above the squeezing of Track-1 occurs when adjacent Track-2 is shingle-written to partially overlap Track-1. Therefore, while Track-2 is being written, the PES2(i) value measured at each SID(i) and saved in memory 82 in this embodiment. The method can do the delta calculations after Track-2 has been completely written or the PES2(i) values can be processed to find the deltas while Track-2 is written. The method calculates ΔPES(i) as the absolute value of the difference between PES2(i) and PES1(i):

$$\Delta PES(i) = |PES1(i) - PES2(i)|; \text{ for } i = 0 \ldots N$$

For each ΔPES(i) that is less than the selected threshold value, the Sector_Squeeze_Count is incremented 83. The threshold is determined empirically for a particular disk drive design. It is also possible to use more than one threshold value. For example, a very low delta PES might suggest that more data sectors are squeezed in both the preceding and following servo sector and, therefore, that the Sector_Squeeze_Count should be increased by two instead of one. Therefore, some embodiments might implement a two-tiered threshold scheme.

The Sector_Squeeze_Count is an estimate of narrowed/squeezed data track width at the SID. Between SIDs there can be multiple user data sectors, and the required count of on-demand parity sectors is obtained by multiplying the Sector_Squeeze_Count by a number representative of data sectors per servo sectors in the particular track, which is defined for each data zone 84. The resulting number of on-demand parity sectors are allocated in integer increments 85.

The data sector size is typically a fixed length either 512 bytes or 4K bytes. Current disk drives have same number of servo sectors per track across the entire disk surface, arranged in servo wedges, which can number in the hundreds, for example 420. Because the outer tracks have more recording capacity between SIDs than the inner ones, the tracks are divided into zones (also called regions or bands) which have a fixed number of data sectors per track. The outer zones have more data sectors per track. As an example, the outermost zone might have 3250 data sectors per track that are 512 bytes. Assuming 420 SIDs per track, there are about 7.7 data sectors per SID. The data sector number is not necessarily an integer multiple of SIDs, and some data sectors can be divided by the SID in the servo pattern, which creates a split data sector. One embodiment uses the ratio of SIDs to data sectors as the multiplier, then round up to an integer value of parity sectors. If for example, the Sector_Squeeze_Count was 4 for a track in this outer zone, then 4*7.7 results in 31 on-demand parity sectors being generated. Continuing the same example, a track in the innermost zone might use a multiplier of about 3.8.

The invention claimed is:

1. A data storage device that stores data in a region on a disk in a plurality of tracks that include a plurality of sectors of data, the data storage device comprising:
    a track-level error correction system that writes a first set of parity sectors on a selected first track on the disk in addition to a first set of sectors of data, the first set of parity sectors being calculated using the first set of sectors of data stored in a memory; and
    an on-demand error correction system that determines a number of data sector errors in the first set of sectors of data on the first track after an adjacent second track has been written, and responsive to the number exceeding a selected threshold value, writes a second set of parity sectors calculated using the first set of sectors of data stored in the memory, and wherein the second set of parity sectors is written on a selected third track that is different from the selected first track.

2. The data storage device of claim 1 wherein there are $R_1$ parity sectors in the first set of parity sectors and $R_1$ is constant for all tracks in the region;
    and there are $R_2$ parity sectors in the second set of parity sectors and $R_2$ varies in size according to the number of data sector errors and has a maximum size larger than $R_1$.

3. The data storage device of claim 1 where there are $R_1$ parity sectors in the first set of parity sectors and $R_2$ parity sectors in the second set of parity sectors and wherein a process of retrieving data from the selected first track includes error correction of up to $R_1$ data sectors by the track-level error correction system using the first set of parity sectors;
    and wherein the on-demand error correction system performs error correction when the track-level error correction system fails to correct all errors detected in the data as read from the disk from the selected first track; and the on-demand error correction system performs error correction using the first and second sets of parity sectors to correct up to $R_1+R_2$ data sectors.

4. The data storage device of claim 1 wherein the on-demand error correction system updates an Indirection Table to establish linkage between the second set of parity sectors and the selected first track.

5. The data storage device of claim 1 wherein the on-demand error correction system generates at least a selected number of parity sectors in the second set of parity sectors that are required to correct the number of data sector errors on the selected first track using the first and second sets of parity sectors.

6. The data storage device of claim 1 wherein the first set of sectors of data are written along with check symbols, which allow detection of erasures, and the number of data sector errors is determined using the check symbols and data as read from the disk.

7. The data storage device of claim 1 wherein the number of data sector errors is determined by comparing a first set of position error signal values, which are measured while writing the first set of sectors of data on the selected first track, with a second set of position error signal values, which are measured while writing the second set of sectors of data on the adjacent second track, to estimate a number of data sectors in the first set of sectors of data with squeeze errors based on a delta between corresponding elements in the first and second sets of position error signal values being below a selected value.

8. The data storage device of claim 7 wherein the on-demand error correction system transfers the $R_1$ subsets of the parity sectors from SRAM to DRAM by Direct Memory Access (DMA) for each iteration.

9. The data storage device of claim 1 wherein the first set of parity sectors includes a fixed number $R_1$ of parity sectors and track level error correction system uses $R_1$ multipliers that each include an SRAM to generate the $R_1$ parity sectors, and wherein the second set of parity sectors includes a variable number $R_2$ of parity sectors and $R_2$ is greater than $R_1$ for a subset of tracks and wherein the on-demand error correction system uses the $R_1$ multipliers to generate $R_2$ parity sectors by iteratively generating $R_1$ subsets of the $R_2$ parity sectors.

10. The data storage device of claim 1 wherein the track level and on-demand error correction system use a Cauchy-Matrix to generate the parity sectors.

11. A method of operating a data storage device that stores data in a region on a disk in tracks that include a plurality of sectors of data, the method comprising:
   writing a first set of data sectors stored in a memory on a selected first track along with a first set of parity sectors calculated using the first set of data sectors;
   writing an adjacent second track next to the selected first track; and
   determining a number of data sector errors in the selected first track that exist after the adjacent second track has been written, and writing a second set of parity sectors for the selected first track when the number of data sector errors exceeds a selected threshold value, the second set of parity sectors being calculated using the first set of data sectors stored in the memory, and writing the second set of parity sectors on a selected third track that is different from the selected first track.

12. The method of claim 11 wherein writing the first set of data sectors further comprises writing check symbols that allow detection of erasure errors, and the method further comprises:
   reading the first set of data sectors from the selected first track along with the first set of parity sectors and the check symbols; and
   detecting errors in the first set of data sectors using the check symbols and correcting detected errors if detected errors are less than or equal to the number of parity sectors in the first set, otherwise retrieving the second set of parity sectors from the third track and using the first and second sets of parity sectors to correct the detected errors.

13. The method of claim 11 further comprising updating an Indirection Table to establish linkage between the second set of parity sectors and the selected first track.

14. The method of claim 11 wherein the second set of parity sectors contains at least a selected number of parity sectors that are required to correct the data sector errors determined to exist in the selected first track using the first and second sets of parity sectors.

15. The method of claim 11 wherein writing the first set of data sectors further comprises writing check symbols that allow detection of erasure errors, and the data sector errors are determined by reading the selected first track from disk and using the check symbols to detect errors.

16. The method of claim 11 wherein the data sector errors are determined by comparing a first set of position error signal values, which are measured while writing the selected first track, with a second set of position error signal values, which are measured while writing the adjacent second track, to estimate the number of data sector errors in the first set of data sectors based on a delta between corresponding elements in the first and second sets of position error signal values being below a selected value.

17. The method of claim 11 wherein the first set of parity sectors includes a fixed number $R_1$ of parity sectors for each track in the region and the device uses $R_1$ multipliers that each include an SRAM to generate the $R_1$ parity sectors, and wherein the second set of parity sectors includes a variable number $R_2$ of parity sectors that varies between tracks in the region and $R_2$ is greater than $R_1$ for a subset of tracks and wherein the device uses the $R_1$ multipliers to generate $R_2$ parity sectors by iteratively generating $R_1$ subsets of the $R_2$ parity sectors.

18. The method of claim 17 wherein the device transfers the $R_1$ subsets of the parity sectors from SRAM to DRAM by Direct Memory Access (DMA) for each iteration.

19. The method of claim 11 wherein the first and second sets of parity sectors are generated using a Cauchy-Matrix.

20. The method of claim 19 wherein the second set of parity sectors is variable in size and is larger than the first set of parity sectors for a subset of tracks.

* * * * *